United States Patent
Liu et al.

(10) Patent No.: US 12,294,223 B2
(45) Date of Patent: May 6, 2025

(54) PRINTED CONDUCTOR AND RECTIFIER PACKAGE FOR POWER TRANSFER

(71) Applicant: Toyota Motor Engineering & Manufacturing North America, Inc., Plano, TX (US)

(72) Inventors: Yanghe Liu, Ann Arbor, MI (US); Feng Zhou, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 716 days.

(21) Appl. No.: 17/411,444

(22) Filed: Aug. 25, 2021

(65) Prior Publication Data
US 2023/0067293 A1    Mar. 2, 2023

(51) Int. Cl.
*H02J 50/00* (2016.01)
*H05K 1/02* (2006.01)
(Continued)

(52) U.S. Cl.
CPC ............ *H02J 50/005* (2020.01); *H05K 1/024* (2013.01); *H05K 1/0242* (2013.01); *H05K 3/4688* (2013.01); *B60L 53/122* (2019.02)

(58) Field of Classification Search
CPC ...... H02J 50/005; B60L 53/122; H05K 1/024; H05K 1/0242; H05K 3/4688
(Continued)

(56) References Cited

U.S. PATENT DOCUMENTS

| | | | |
|---|---|---|---|
| 9,818,527 B2* | 11/2017 | Zabaco | ............... H01F 27/2804 |
| 10,405,406 B2* | 9/2019 | Liszt | ....................... F21V 33/00 |

(Continued)

FOREIGN PATENT DOCUMENTS

| | | |
|---|---|---|
| CN | 108521841 A | 9/2018 |
| CN | 209419645 U | 9/2019 |

(Continued)

OTHER PUBLICATIONS

Xu et al., "Multi-coil high efficiency wireless power transfer system against misalignment," 2018 IEEE MTT-S International Wireless Symposium (IWS), 2018, pp. 1-3.
(Continued)

*Primary Examiner* — Nathaniel R Pelton
(74) *Attorney, Agent, or Firm* — Christopher G. Darrow; Darrow Mustafa P.C.

(57) ABSTRACT

System, methods, and other embodiments described herein relate to using a printed conductor and a rectifier in the same enclosure for transferring power. In one embodiment, an apparatus includes a conductor, printed on a substrate housed in an enclosure, that generates alternating current caused by a magnetic field emitted by a transmitter, wherein the conductor is a trace spanning layers. The apparatus also includes a rectifier, on a device housed in the enclosure, that receives the alternating current through a terminal connected with the conductor and converts the alternating current to a direct current for powering a load, wherein an insulator between the conductor and the rectifier isolates the magnetic field.

20 Claims, 3 Drawing Sheets

(51) Int. Cl.
*H05K 3/46* (2006.01)
*B60L 53/122* (2019.01)

(58) Field of Classification Search
USPC .......................................................... 320/109
See application file for complete search history.

(56) References Cited

U.S. PATENT DOCUMENTS

| | | | | |
|---|---|---|---|---|
| 10,622,842 | B2* | 4/2020 | Lee | H02J 50/12 |
| 11,641,117 | B2* | 5/2023 | Carlson | H02J 7/00304 |
| | | | | 320/107 |
| 2012/0112535 | A1* | 5/2012 | Karalis | B60L 53/124 |
| | | | | 307/9.1 |
| 2016/0172104 | A1* | 6/2016 | Mirbozorgi | H02J 50/12 |
| | | | | 320/108 |
| 2017/0011837 | A1* | 1/2017 | Hassan-Ali | H01F 27/2804 |
| 2018/0358833 | A1* | 12/2018 | Lee | H02J 50/70 |
| 2021/0075260 | A1* | 3/2021 | Kato | H02J 50/90 |
| 2021/0078417 | A1 | 3/2021 | Kamineni et al. | |
| 2021/0257846 | A1* | 8/2021 | Na | H01L 23/49575 |

FOREIGN PATENT DOCUMENTS

| | | |
|---|---|---|
| EP | 0911717 A1 | 4/1999 |
| KR | 20130020542 A | 2/2013 |
| WO | 2009045888 A2 | 4/2009 |

OTHER PUBLICATIONS

Lope et al., "Design and Implementation of PCB Inductors With Litz-Wire Structure for Conventional-Size Large-Signal Domestic Induction Heating Applications," IEEE Transactions on Industry Applications, vol. 51, No. 3, 2015, pp. 2434-2442.

* cited by examiner

PRINTED CONDUCTOR AND RECTIFIER PACKAGE FOR POWER TRANSFER

TECHNICAL FIELD

The subject matter described herein relates, in general, to printed conductors for power transfer over the air, and, more particularly, to a device that integrates a printed conductor and a rectifier.

BACKGROUND

Systems transfer power through induction without contact between conductors. For example, these systems use a conductor in a device that inductively couples with a source emitting energy. Alternating current passes through a conductor in the source. Correspondingly, moving electric charge creates a magnetic field that fluctuates in strength from amplitude changes of the alternating current. This changing magnetic field creates an alternating current in the conductor of the device that feeds a rectifier. Direct current is generated by the rectifier to power a load, thereby completing wireless power transfer.

In various implementations, the conductor in the device uses particular wiring for capturing magnetic fields emitted by a source transmitter. For example, a multi-strand wire (e.g., Litz wire) is coiled for increasing surface area and reducing interference. Using specialized wires involves manual assembly, increased size, and increased cost. For example, an electric vehicle uses a rectifier box separate from the conductor device for charging due to coil sizes. This arrangement may also increase cost and profile size from using high-frequency alternating current (AC) cables for connecting the rectifier box and the conductor device.

SUMMARY

In one embodiment, example systems relate to using a printed conductor and a rectifier in the same enclosure for transferring power. In various implementations, systems use a coil of wires to receive power through inductive transfer. These wires are bulky and using such wires in a device can involve manual assembly, which causes difficulties with manufacturing and increases weight. Also, bulky coils result in systems installing the rectifier, that energizes a load, in a separate unit. This arrangement in electric vehicles, for example, increases cost since the system uses high-frequency cables to connect the coil and the rectifier. Therefore, in one embodiment, a system integrates a conductor printed on a circuit board and a rectifier in an enclosure for transferring power. A printed conductor reduces costs, weight, and manufacturing complexity. For example, the conductor is manufactured using a printed circuit board (PCB) process and emulates a coil of wires in an electric vehicle. The PCB converts a magnetic field to alternating current (AC) for charging a battery in the vehicle. In one approach, the conductor also includes layers that form a staggered pattern by spanning multiple dimensions to increase the area for receiving the magnetic field. The increased area generates more alternating current and accordingly more output power. In this way, the layers are equivalent to turns of a coil in manually wired implementations. Furthermore, an insulator between the conductor and the rectifier contains the magnetic field to protect the rectifier from damage, thereby allowing the compact integration. Accordingly, the system integrates a printed conductor that receives power over the air with a rectifier in a single package with decreased cost and size.

In one embodiment, an apparatus using a printed conductor and a rectifier in the same enclosure for transferring power is disclosed. In one embodiment, the apparatus includes a conductor, printed on a substrate housed in an enclosure, that generates alternating current caused by a magnetic field emitted by a transmitter, wherein the conductor is a trace spanning layers. The apparatus also includes a rectifier, on a device housed in the enclosure, that receives the alternating current through a terminal connected with the conductor and converts the alternating current to a direct current for powering a load, wherein an insulator between the conductor and the rectifier isolates the magnetic field.

In one embodiment, an apparatus using a printed conductor and a rectifier in the same enclosure for transferring power is disclosed. In one embodiment, the apparatus includes a printed conductor, located in an enclosure, that generates current when induced by a magnetic field emitted by a transmitter, wherein the printed conductor is a trace spanning copper layers and the printed conductor is manufactured using a PCB process. The apparatus also includes a rectifier, parallel with the printed conductor on a device located in the enclosure, that receives the current through shared terminals with the printed conductor and converts the current to supply a load, wherein an insulator parallel to the printed conductor and the rectifier isolates the magnetic field.

In one embodiment, an apparatus using a printed conductor and a rectifier in the same enclosure for transferring power is disclosed. In one embodiment, the apparatus includes a printed conductor, fixed in an enclosure, that generates current when induced by a magnetic field emitted by a transmitter, wherein the printed conductor is a trace having copper layers and the printed conductor is manufactured using a PCB process. The apparatus also includes a converter, on a device fixed in the enclosure, that receives the current through common terminals with the printed conductor and the converter alters the current to power a load. The apparatus also includes a ferrite insulator above the printed conductor and below the converter that isolates the magnetic field.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Systems, methods, and other embodiments associated with a printed conductor and a rectifier in the same enclosure for transferring power are disclosed herein. In various implementations, systems using a coil of wires to transfer power through induction are bulky and expensive. These systems also involve complex manufacturing as building the coil of wires includes manual steps. Therefore, in one embodiment, a system for transferring power uses a conductor printed compactly on a substrate for integrating with a rectifier in the same enclosure. A manufacturing system, in one approach, layers the conductor to make traces on a circuit board emulate a coil of wires. The traces on the circuit board are similar to turns in a coil of wires and generate alternating current (AC) caused by a magnetic field. The energy captured from the magnetic field is emitted by a transmitter and increases with the density of layers and traces. Regarding system outputs, in one configuration, the rectifier uses diodes forming a full-circuit bridge that converts the alternating current to direct current (DC) for powering a load (e.g., charging a battery).

In one approach, fabricating the conductor uses a printed circuit board (PCB) process in a staggered pattern for the layers that increases surface area to capture the magnetic field. In one approach, the layers span multiple levels in the z or y dimensions, thereby increasing surface area and density. A controller in the enclosure can also output different power from the rectifier by, for example, activating a subset of the layers. In this way, the system adaptively and efficiently provides various DC outputs for different applications.

Furthermore, the system can compactly stack the conductor and the rectifier to reduce a profile and a size. In this arrangement, an insulator plate (e.g., ferrite) between the conductor and rectifier protects the circuit board having the rectifier, controllers, and other components from powerful magnetic fields emitted by the transmitter. To prevent overheating, in one arrangement, separate heat sinks at the top and bottom of the enclosure concurrently cool the conductor and the rectifier. A manufacturing system can arrange a heat sink with metal fins on the rectifier to dissipate heat without causing interference due to the shielding from the insulator plate. The bottom heat sink may be conductive plastic to avoid interference with the magnetic fields. Accordingly, the system for transferring power uses a printed conductor that reduces the size of the enclosure and allows integration with the rectifier while emulating a coil.

Figure 1:
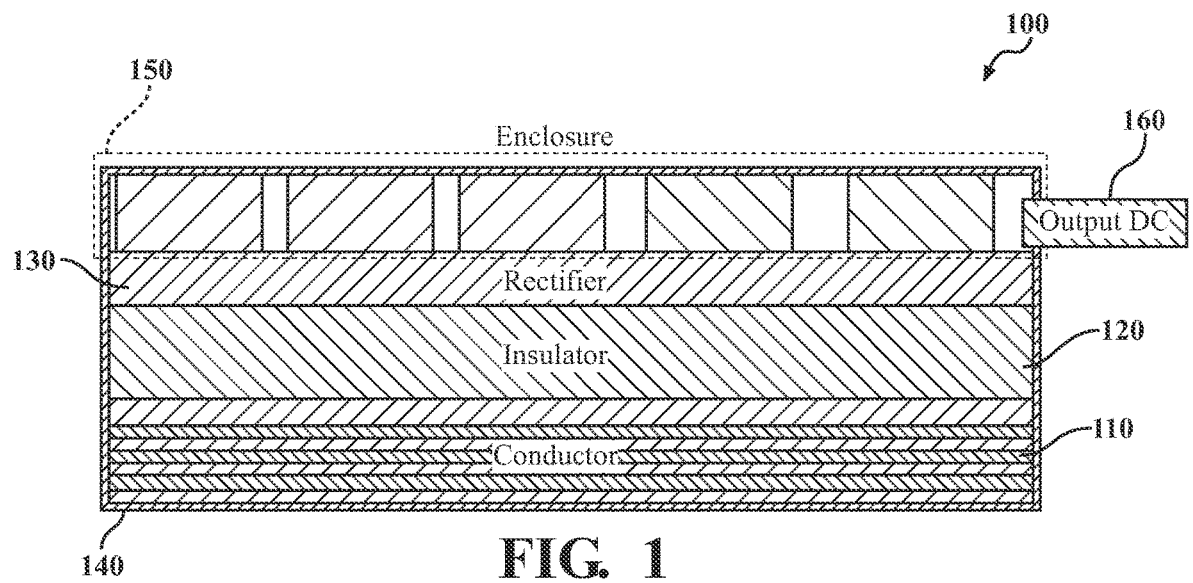
FIG. 1 illustrates one embodiment of a system having a conductor and a rectifier in the same enclosure for transferring power through induction.

Now turning to FIG. 1, the system 100 illustrates one embodiment using a conductor and a rectifier in the same enclosure for transferring power through induction. In various implementations, a manufacturing system integrates a conductor 110, an insulator 120, and a rectifier 130 compactly in the enclosure 140. A manufacturing system prints the conductor 110 on a circuit board to emulate systems that use a coil of wires for wirelessly capturing power. As explained below, the conductor 110 is printed and woven as traces in single or multiple layers on a substrate for capturing magnetic fields from a transmitter. In one approach, the surface area of the layers is related to a number of turns in systems using a coil of wires.

Regarding fabrication, PCB processing is a standardized method used to integrate systems having multiple components. As such, PCB processing can print the conductor 110 using copper on a substrate exhibiting a low profile, thereby optimizing space in the enclosure 140. Using PCB also reduces costs and manual tasks compared to manufacturing power systems that use a coil of wires. For example, wireless chargers may use Litz wire to form a planar coil for transferring power. Litz wire is a multi-stranded wire made from hundreds or thousands of individually insulated strands. These insulated strands reduce skin and proximity losses while capturing sufficient energy to induce a current. However, manufacturing Litz wire involves manual tasks that increase system complexity and costs. Thus, as explained below, the system 100 uses a conductor that a manufacturing system prints in layers and traces to emulate systems using Litz wire for transferring power wirelessly.

Moreover, printing the conductor 110 for transferring power reduces the overall size and weight of the system 100. For instance, the system 100 can be produced at less than 3 centimeters (cm) and 5 pounds (lbs) from the compact manufacturing of PCB-based systems. However, a system using a coil of wires (e.g., Litz wire) will be 10-20 cm and 10-20 lbs. In implementations for electric vehicles, the system 100 also increases efficiency since the conductor 110 and rectifier 130 are contained in the same housing resulting from the reduced size. For instance, the system 100 is integrated by a manufacturing system into a vehicle pad or receiver that captures energy from a ground pad emitting a magnetic field. When the conductor 110 and the rectifier 130 are in different devices, systems use a bulky alternating current (AC) cable to connect the devices. A heavy-duty AC cable is needed since the conductor 110 produces increased power at higher frequencies for charging the electric vehicle. Thus, the system 100 occupies less space in the electric vehicle by a process printing the conductor 110, thereby reducing the size of the enclosure 140, allowing integration with the rectifier 130, and operating without the AC cable.

Regarding the operation of the rectifier 130, the system 100 feeds the alternating current generated by the conductor 110 to the rectifier 130 for DC conversion. In various implementations, the rectifier uses diodes (e.g., 2-4 diodes) that form a full-bridge circuit that converts the direct current. As described below, the rectifier 130 may receive the alternating current using terminals in common positions with the conductor 110 on respective circuit boards, further reducing size and profile. Referring again to the insulator 120, the system 100 may use the insulator 120 (e.g., a ferrite plate) to protect the rectifier 130, the full-bridge circuit, capacitors, inductors, and controllers 150 from powerful magnetic fields emitted by the ground pad. These passive and active components can be damaged from magnetic fields, particularly for increased power applications. Once the rectifier converts the alternating current, the output 160 feeds a battery, load, motor, etc. with the direct current.

Figure 2:
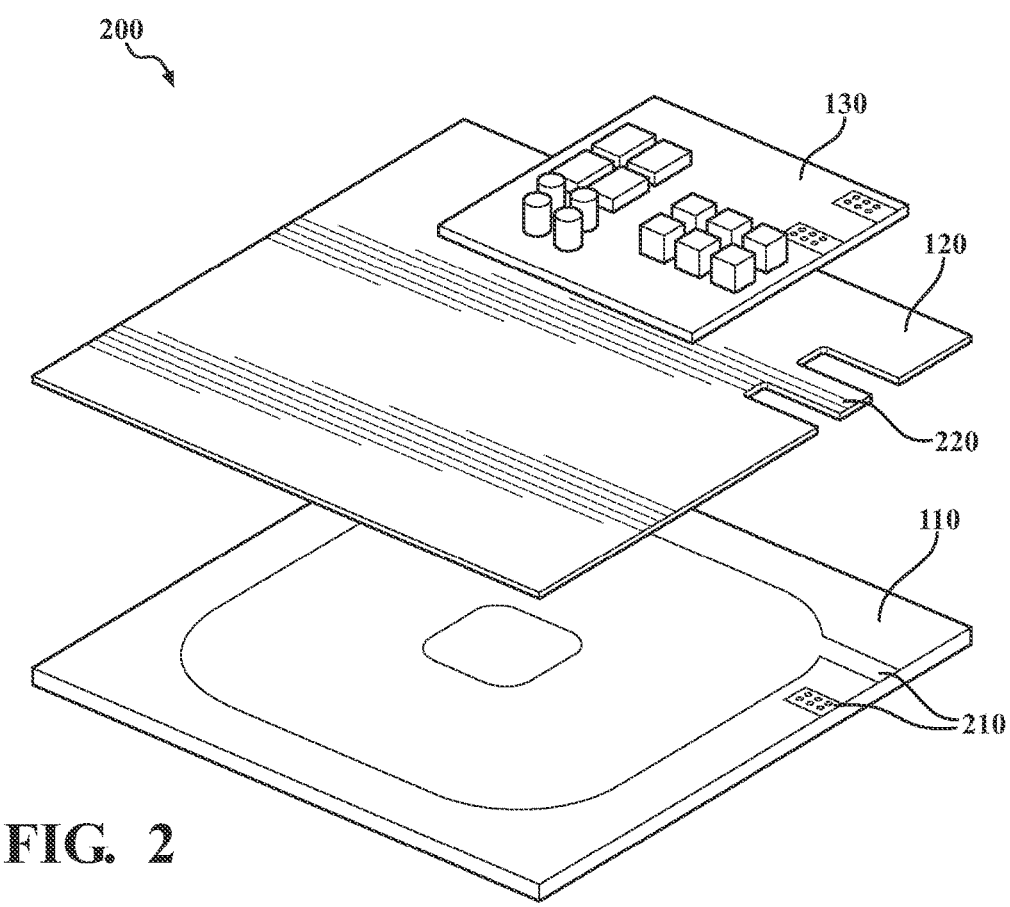
FIG. 2 illustrates an angled view of an enclosure having a conductor, an insulator, and a rectifier for transferring power through induction.

Regarding compact profiles, FIG. 2 illustrates an angled view 200 of an enclosure having a conductor, an insulator, and a rectifier for transferring power through induction. Here, the terminals 210 comprises a shared or common input/output (I/O) point for the alternating current between the conductor 110 and the rectifier 130. A manufacturing system may fabricate the terminals 210 in a similar position on the circuit boards for the conductor 110 and the rectifier 130 to improve space management and reduce transmission length of the alternating current. In this way, the system 100 reduces heat and losses from the alternating current generated by the conductor 110 traveling a shorter distance. Furthermore, the insulator 120 includes a cutout 220 for the terminals 210 for allowing the connection and soldering. The cutout 220 may be shaped according to the profile of the terminals 210 (e.g., rectangular, square, round, etc.). In this way, the arrangement optimizes space in the enclosure 140.

Figure 3:
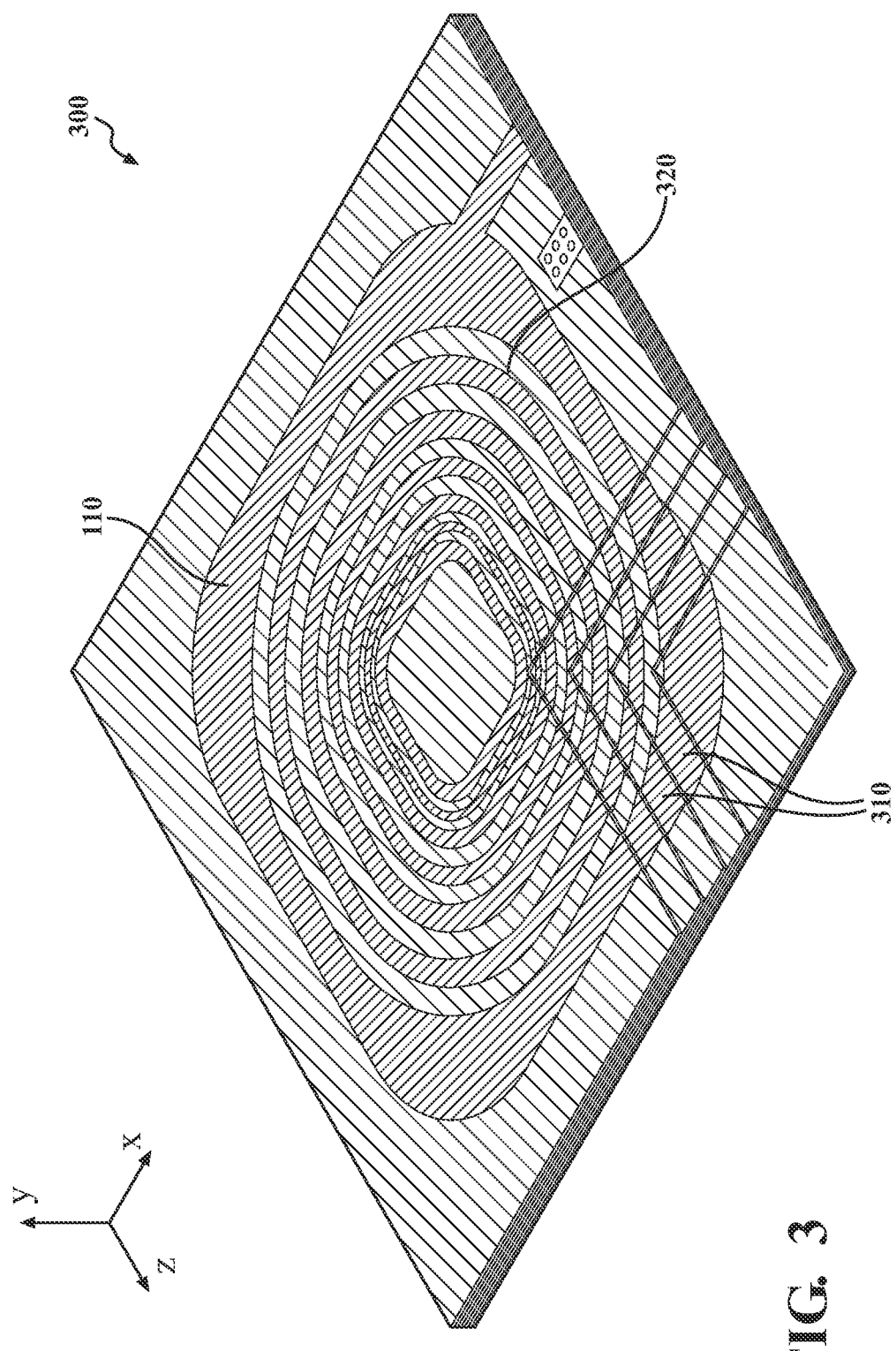
FIG. 3 illustrates one embodiment of a conductor printed on a circuit board as traces arranged in layers.

Turning now to fabrication details, FIG. 3 illustrates one embodiment of the conductor 110 printed by a manufacturing system on a circuit board 300 as traces using the layers 310. In various implementations, a PCB fabrication system prints and structures the conductor 110 as a copper trace. Depending on power demands for the output 160, the conductor 110 may be a single layer insulated with flame retardant (FR) material. For instance, FR4 is a fiberglass-reinforced epoxy in a laminated sheet used for PCB fabrication. The FR4 can laminate and insulate layers of copper. Layering (e.g., 8 layers) increases the density of traces without thermal breakdown, thereby allowing scaling of power levels. In one approach, a manufacturing system prints the layers such that they span multiple levels in the z and/or y dimensions. As a result, the conductor 110 captures more of the magnetic field from the power transmitter and performs efficiently at increased power levels. For example, in vehicle applications power levels of 3.3 kilowatts (KW), 7 kW, or 11 kW are achievable for contactless or wireless charging using the system 100.

Moreover, the circuit board 300 includes traces printed in various shapes to emulate coils. For instance, the shape may be oval, round, or square according to the packaging or form factor specifications of the application. The shape may match the ground pad or transmitter dimensions to maximize alignment for capturing the magnetic fields. Furthermore, insulator 320 (e.g., fiberglass) is used between layers of the conductor 110 to emulate an elongated wire, such as a spiraled coil, that increases surface area. The insulating allows denser and more shape options during fabrication.

Faster, efficient, and flexible power transfer is also provided by the system 100 using the layers 310. Heat and efficiency losses in systems using a coil of wires increases at higher power levels. Faster charging requires increased power levels with thermal management to prevent component (e.g., battery) damage. Furthermore, heat loss for charging electric vehicles increases carbon footprint, thereby reducing advantages over motor engines. Moreover, the layers 310 increase flexibility through a controller that activates or selects layers, thereby drawing different power levels. For example, a controller may have the rectifier 130 convert power from a subset or portion of the layers 310 to output 3.3 kW or 7 kW. In this way, the system 100 adaptively and efficiently provides various DC outputs.

Moreover, in various implementations the width of traces (e.g., copper traces) are fabricated to vary according to location on a PCB device. In this way, the system 100 achieves more uniform current distribution and temperature consistency, thereby also improving reliability. For example, in FIG. 3 an outer trace is printed by a process to be wider and thus carry more current. As such, the PCB based system 100 can balance current density for multiple turns of coil by specific trace dimensions. On the other hand, systems using Litz wire for power transfer use one grade wire causing less uniform current distribution.

Figure 4:
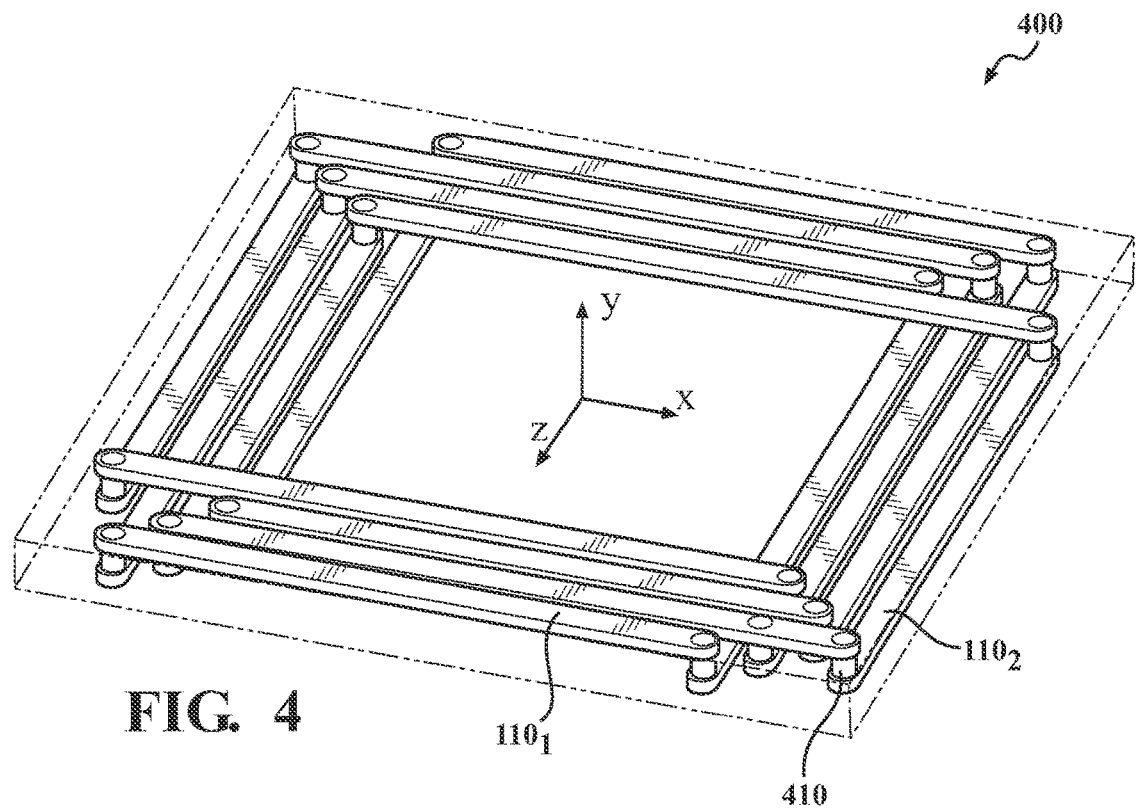
FIG. 4 illustrates one embodiment of using a staggered pattern for connecting layers of a conductor to emulate a coil of wires for transferring power.

In one approach, a manufacturing system layers the conductor 110 in a manner to increase surface area and thereby turns equivalent to a coil of wires. FIG. 4 illustrates one embodiment of using a staggered pattern 400 for connecting layers of a conductor to emulate a coil for transferring power. The conductor 1101 is a copper trace on a top layer. The conductor 1102 is a copper trace on a bottom layer that is connected to the conductor 1101 using the connector 410. For example, the connector 410 is a via connector used in PCB fabrication. In one approach, a staggered pattern increases layers and space for traces on a PCB. In one approach, a manufacturing system may print the layers such that they span multiple levels in the z and/or y dimensions. Manufacturing costs may also decrease using this pattern by reusing layout rules for positioning the conductor 1101 and the conductor 1102. In addition, the PCB can use a step formation where the conductor 1101 and the conductor 1102 are offset and connected using lateral connections. In this way, a system fabricates the conductor 110 to increase power capture using a compact form factor.

Figure 5:
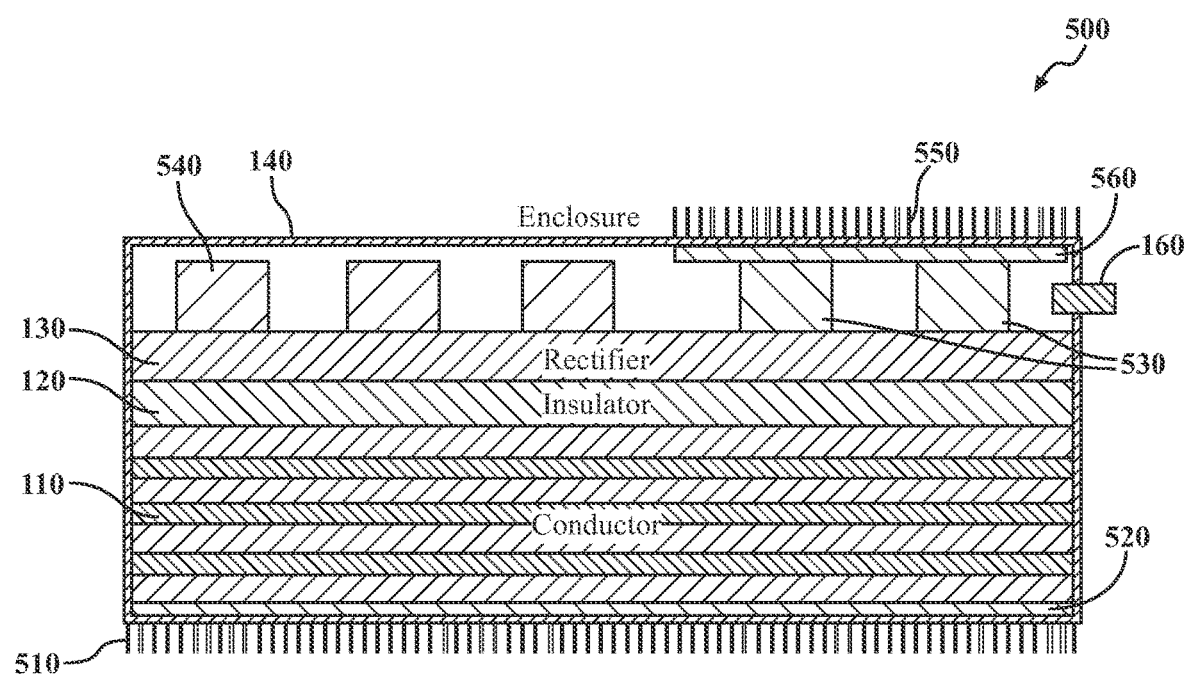
FIG. 5 illustrates one embodiment of cooling a system that transfers power through induction using a conductor and a rectifier in the same enclosure.

Returning to thermal management, FIG. 5 illustrates one embodiment of cooling a system 500 that transfers power through induction using a conductor and a rectifier in the same enclosure. In one approach, the heat sink 510 uses fins to dissipate excess heat from the alternating current generated by the conductor 110. The fins may be conductive plastic instead of metal to spread the heat without causing interference with the magnetic field from a transmitter or generating additional heat. Heat management is also improved using additional components. The system 100 may also use the thermal grease and plastic component 520 for increasing heat transfer to the heat sink 510 via the enclosure 140. In one approach, the enclosure is made of a composite (e.g., plastic, fiberglass, etc.). As such, the heat sink 510 passively cools the conductor 110 for thermal management of the system 500.

In various implementations, the rectifier 130 utilizes the diodes 530 to form a full-bridge circuit for AC/DC conversion. Unlike the passive capacitors and resistors 540, the full-bridge circuit is an active device that generates excessive heat, particularly when converting increased power levels of alternating current. As such, the heat sink 550 uses metal or conductive plastic fins to spread the heat from the diodes 530 for dissipation. Here, metal instead of conductive plastic is utilized since the insulator 120 (e.g., ferrite) shields the diodes 530, the passive capacitors and resistors 540, and other components associated with the rectifier 130 from powerful magnetic fields. Furthermore, the thermal grease and plastic component 560 increases contact and heat transfer between the heat source and the heat sink 550, thereby improving heat reduction. Accordingly, the system 500 passively and concurrently cools the conductor 110 and the rectifier 130 through the heat sinks 510 and 550.

Detailed embodiments are disclosed herein. However, it is to be understood that the disclosed embodiments are intended as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Furthermore, the terms and phrases used herein are not intended to be limiting but rather to provide an understandable description of possible implementations. Various embodiments are shown in FIGS. 1-5, but the embodiments are not limited to the illustrated structure or application.

The systems, components, and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components, and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises the features enabling the implementation of the methods described herein and, which when loaded in a processing system, is able to carry out these methods.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all combinations of one or more of the associated listed items. As an example, the phrase "at least one of A, B, and C" includes A, B, C, or any combination thereof (e.g., AB, AC, BC or ABC).

Additionally, it will be appreciated that for simplicity and clarity of illustration, where appropriate, reference numerals have been repeated among the different figures to indicate corresponding or analogous elements. In addition, the discussion outlines numerous specific details to provide a thorough understanding of the embodiments described herein. Those of skill in the art, however, will understand that the embodiments described herein may be practiced using various combinations of these elements.

Aspects herein can be embodied in other forms without departing from the spirit or essential attributes thereof. Accordingly, reference should be made to the following claims, rather than to the foregoing specification, as indicating the scope hereof.

What is claimed is:

1. An apparatus for power transfer over air, comprising:
a conductor, printed on a substrate housed in an enclosure, that generates alternating current caused by a magnetic field emitted by a transmitter, wherein the conductor is a trace spanning layers and the trace is perpendicular with the substrate, and a surface area and a width of the trace equal turns for a wire coil, and the trace has subtraces forming a staggered pattern within one of the layers and forms the staggered pattern between at least two of the layers; and
a rectifier, on a device housed in the enclosure, that receives the alternating current through a terminal connected with the conductor and converts the alternating current to a direct current for powering a load, wherein an insulator between the conductor and the rectifier isolates the magnetic field.

2. The apparatus of claim 1, wherein the conductor is part of a printed circuit board (PCB) and the conductor is printed in the layers on the PCB using the staggered pattern by connecting at least two of the layers using a via.

3. The apparatus of claim 1, wherein the enclosure includes a controller that outputs different power from the rectifier by activating a subset of the layers.

4. The apparatus of claim 1, wherein the layers form the wire coil on a printed circuit board (PCB) and a current level of the alternating current relates to surfaces of the layers exposed to the magnetic field.

5. The apparatus of claim 1, wherein the trace emulates the wire coil in a pad to charge a vehicle.

6. The apparatus of claim 1, wherein the rectifier comprises a plurality of diodes that form a full-bridge circuit to convert the alternating current to the direct current.

7. The apparatus of claim 6, wherein the enclosure comprises a first heat sink that is metal and is positioned proximate to the plurality of diodes and a second heat sink that is plastic and is positioned proximate to the conductor opposite from the rectifier for concurrently cooling the conductor and the rectifier.

8. The apparatus of claim 1, wherein fiberglass between at least two of the layers isolates portions of the trace.

9. An apparatus for power transfer over air, comprising:
a printed conductor, located in an enclosure, that generates current when induced by a magnetic field emitted by a transmitter, wherein the printed conductor is a trace spanning copper layers and the printed conductor is manufactured using a printed circuit board (PCB) process, and a surface area and a width of the trace equal turns for a wire coil, and the trace has subtraces forming a staggered pattern within one of the copper layers and forms the staggered pattern between at least two of the copper layers; and
a rectifier, parallel with the printed conductor on a device located in the enclosure, that receives the current through shared terminals with the printed conductor and converts the current to supply a load, wherein an insulator parallel to the printed conductor and the rectifier isolates the magnetic field and the trace is perpendicular with the rectifier.

10. The apparatus of claim 9, wherein the printed conductor in the copper layers is staggered by coupling the copper layers using a multi-layer connector.

11. The apparatus of claim 9, wherein the enclosure includes a microcontroller that outputs variable power from the rectifier by energizing different sections of the copper layers.

12. The apparatus of claim 9, wherein the copper layers form the wire coil and a power level of the current relates to areas of the copper layers energized by the magnetic field.

13. The apparatus of claim 9, wherein the trace emulates the wire coil in a pad for contactless charging.

14. The apparatus of claim 9, wherein the rectifier comprises at least two diodes that form a full-bridge to convert the current to a direct current.

15. The apparatus of claim 14, wherein the enclosure comprises a first heat sink that is metallic and is positioned near the at least two diodes and a second heat sink that is a composite and is positioned near the printed conductor opposite from the rectifier for concurrently cooling the printed conductor and the rectifier.

16. The apparatus of claim 9, wherein fiberglass between at least two of the copper layers isolates portions of the trace.

17. An apparatus for power transfer over air, comprising:
a printed conductor, fixed in an enclosure, that generates current when induced by a magnetic field emitted by a transmitter, wherein the printed conductor is a trace having copper layers and the printed conductor is manufactured using a printed circuit board (PCB) process, and a surface area and a width of the trace equal turns for a wire coil, and the trace having subtraces forming a staggered pattern within one of the copper layers and forming the staggered pattern between at least two of the copper layers;

a converter, on a device fixed in the enclosure, that receives the current through common terminals with the printed conductor and the converter alters the current to power a load, and the trace is perpendicular with the converter; and a ferrite insulator above the printed conductor and below the converter that isolates the magnetic field.

18. The apparatus of claim 17, wherein the printed conductor in the copper layers spans multiple levels by connecting at least two of the copper layers using a via.

19. The apparatus of claim 17, wherein the enclosure is fiberglass and includes a controller that outputs different power from the converter by drawing from portions of the copper layers.

20. The apparatus of claim 17, wherein the converter comprises diodes that form a full-bridge circuit to convert the current to a direct current and the enclosure comprises a metal heat sink positioned above the diodes and a plastic heat sink positioned below the printed conductor for concurrently cooling the printed conductor and the converter.

* * * * *